United States Patent
Zhao et al.

(10) Patent No.: US 11,758,641 B2
(45) Date of Patent: Sep. 12, 2023

(54) POWER SUPPLY SYSTEM FOR IMPROVING PLASMA UNIFORMITY AND METHOD THEREOF

(71) Applicant: Dalian University of Technology, Dalian (CN)

(72) Inventors: Kai Zhao, Dalian (CN); Zixuan Su, Dalian (CN); Yongxin Liu, Dalian (CN); Younian Wang, Dalian (CN)

(73) Assignee: Dalian University of Technology, Dalian (CN)

( * ) Notice: Subject to any disclaimer, the term of this patent is extended or adjusted under 35 U.S.C. 154(b) by 268 days.

(21) Appl. No.: 17/228,124

(22) Filed: Apr. 12, 2021

(65) Prior Publication Data

US 2022/0183136 A1    Jun. 9, 2022

(30) Foreign Application Priority Data

Dec. 7, 2020   (CN) .......................... 202011427478.4

(51) Int. Cl.
   *H05H 1/46*    (2006.01)
(52) U.S. Cl.
   CPC ................................. *H05H 1/4645* (2021.05)
(58) Field of Classification Search
   None
   See application file for complete search history.

(56) References Cited

U.S. PATENT DOCUMENTS

| | | | |
|---|---|---|---|
| 9,264,076 B2* | 2/2016 | Belot .................. | H04B 1/0014 |
| 9,270,300 B2* | 2/2016 | Belot .................. | H04B 1/0021 |
| 10,756,578 B1* | 8/2020 | Price ................... | H02J 50/80 |
| 11,056,930 B2* | 7/2021 | Price ................... | H02J 50/40 |
| 11,274,369 B2* | 3/2022 | Um .................... | H01L 21/02164 |
| 2006/0208169 A1* | 9/2006 | Breed ................. | B60R 21/01516 250/221 |
| 2014/0233671 A1* | 8/2014 | Belot .................. | H04B 1/406 375/295 |
| 2014/0235186 A1* | 8/2014 | Belot .................. | H04B 1/0014 455/125 |
| 2016/0314943 A1* | 10/2016 | Albarede ............ | H01J 37/3299 |
| 2018/0330921 A1* | 11/2018 | Radomski ......... | H01J 37/32146 |

(Continued)

FOREIGN PATENT DOCUMENTS

WO    WO-2014027695 A1 *  2/2014    ......... A61H 23/0236

*Primary Examiner* — Srinivas Sathiraju
(74) *Attorney, Agent, or Firm* — SAGE PATENT GROUP

(57) ABSTRACT

The present disclosure relates to a power supply system for improving plasma uniformity and a method thereof, wherein the power supply system includes a signal generating device, a first electrode and a second electrode. The signal generator is respectively connected with a plurality of signal processing circuits and is used for generating a plurality of initial signals at different frequencies; the signal processing circuits are used for processing the initial signals at corresponding frequencies; the plurality of signal processing circuits are all connected with the first electrode; and the initial signals are processed by the signal processing circuits and then act on the plasma through the first electrode. The present disclosure may effectively process signals in different power supplies, improve the stability of plasma discharge, reduce the impact of the coupling effect between different power supplies, and realize the independent control of ion flux and ion energy.

17 Claims, 6 Drawing Sheets

(56) References Cited

U.S. PATENT DOCUMENTS

| | | | |
|---|---|---|---|
| 2019/0006157 A1* | 1/2019 | O'Banion | G01N 29/2418 |
| 2019/0067070 A1* | 2/2019 | Boyd, Jr. | H01J 37/32935 |
| 2019/0166700 A1* | 5/2019 | Pape | H05K 1/0212 |
| 2019/0371573 A1* | 12/2019 | Gregor | H01L 21/67069 |
| 2020/0027706 A1* | 1/2020 | Jing | G05B 19/418 |
| 2021/0358727 A1* | 11/2021 | Jing | H01L 21/67248 |
| 2021/0384053 A1* | 12/2021 | Jing | H01J 37/32724 |
| 2022/0013388 A1* | 1/2022 | Daugherty | H01L 21/67288 |
| 2022/0172925 A1* | 6/2022 | Jing | H01L 21/67103 |
| 2022/0183136 A1* | 6/2022 | Zhao | H01J 37/32935 |
| 2022/0247492 A1* | 8/2022 | Jing | H01J 37/32935 |

\* cited by examiner

POWER SUPPLY SYSTEM FOR IMPROVING PLASMA UNIFORMITY AND METHOD THEREOF

CROSS REFERENCE TO RELATED APPLICATION

This application claims the priority of Chinese Patent Application No. 202011427478.4 filed with the Chinese Patent Office on Dec. 7, 2020, which is incorporated herein by reference in its entirety.

TECHNICAL FIELD

The present disclosure relates to the field of semiconductor manufacturing, and in particular to a power supply system for improving plasma uniformity and a method thereof.

BACKGROUND

The capacitively coupled plasma (CCP) source is composed of a pair of plate electrodes in parallel with each other. Because the CCP source can generate a large area of plasma, it is widely applied to the manufacturing process of chips, photovoltaic cells and flat panel displays. Among these applications, the control of plasma uniformity and the independent control of ion flux and ion energy are two core technologies of crucial importance. On one hand, the plasma uniformity determines the etching rate and film deposition rate at different positions on the substrate surface, and finally determines the etching depth and film uniformity. On the other hand, the independent controllability of ion flux and ion energy determines the etching anisotropy, the etching aspect ratio and the film performance.

At present, with the rapid development of semiconductor technologies, a new development trend of industrial CCP sources emerges. On one hand, the driving frequency adopted in CCP sources is growing increasingly higher, since a higher driving frequency can produce a higher plasma density, thereby improving the efficiency of etching and thin film deposition. On the other hand, the chamber size for CCP sources is becoming larger as the wafer size is increasingly larger. However, with the increase of the driving frequency and the discharge chamber size, especially when the electromagnetic wave length in the plasma is equal to the chamber size, the standing wave effect will become significant, thus causing serious spatial plasma inhomogeneity and eventually the inhomogeneity of etching and thin film deposition. Therefore, the control of plasma uniformity has become an urgent problem to be solved in the process of plasma treatment. In addition, with the increase of driving frequency adopted in industrial CCP sources, the sheath voltage decreases in the discharges, resulting in a decrease of the ion bombardment energy. Another urgent problem to be solved in the process of plasma treatment is how to control the ion energy flexibly in the case of a high plasma density. In one word, the current semiconductor industry is in an urgent need of a method that not only improves plasma uniformity, but also independently controls the ion flux and ion energy.

In the prior art, the following methods are applied to the process of improving the plasma uniformity:

(1) An electrode shaped like a Gaussian lens, as shown in FIG. 1, which can effectively compensate the standing wave effect by using a non-uniform electrode gap produced by the electrode at a specific discharge frequency, thus producing a more uniform electrical field between electrodes. However, when the discharge frequency is lower or higher than this operating frequency, the electric field between the electrodes will show "concave" or "convex" distribution characteristics due to "over-compensation" or "under-compensation", and hence, the electrode of the discharge frequency is only suitable for specific discharge parameters (e.g., working gas, pressure, driving frequency, power, etc.). If any discharge conditions change, it will greatly reduce the ability to control the plasma uniformity.

(2) A ladder-shaped electrode is shown in FIG. 2, where voltages are applied at different positions of the ladder-shaped electrode so that the voltages at different positions in the discharge area are almost the same so as to effectively avoiding the high voltage at the discharge center caused by the standing wave effect. However, the ladder-shaped electrode requires a high manufacture cost, a great processing precision, and a great processing difficulty. In addition, these specially structured electrodes are not easy to replace once they have been processed and installed.

(3) Phase shift control method: When an upper electrode and a lower electrode are driven by two power supplies with the same frequency in the discharges, the spatial uniformity of the plasma can be regulated by adjusting the phase difference between the voltages applied to the two electrodes. The prior art has studied the influence of phase shift modulation on the plasma uniformity, of which the result shows that: When the phase difference is 0°, the plasma density peaks at the radial edge due to the coupling between the electrode edge and the grounded sidewall; as the phase difference increases, the coupling between the electrode edge and the sidewall gradually weakens, while the coupling between the two electrodes gradually increases; and when the phase difference is 180°, the plasma uniformity achieves the best. Although this method may optimize the plasma uniformity, it cannot realize the independent control of the ion flux and ion energy during the plasma etching and thin film deposition.

(4) Control of low-frequency source parameters: When a low-frequency source is introduced into a very-high-frequency (VHF) discharge, the plasma uniformity may be optimized by adjusting the parameters of the low-frequency source. The prior art has studied the influence of low-frequency voltage and low-frequency parameters on the radial distribution of plasma density in a VHF (100 MHz) discharge, and found that the standing wave effect can be suppressed or compensated by controlling the low-frequency source parameters, thereby optimizing the plasma uniformity. In this method, to improve the plasma uniformity, it is necessary to increase the low-frequency voltage or reduce the low frequency, which, however, leads to the decrease of the plasma density, the decrease of plasma etching or film deposition efficiency, and the increase of ion bombardment energy which may easily damage the substrate surface. While the ion bombardment energy changes correspondingly as the low-frequency voltage or low frequency changes, due to a strong coupling effect between the high-frequency power supply and the low-frequency power supply, changing the low-frequency source parameters will also cause a significant change to the ion flux (density), which is adverse to the independent control of ion flux and ion energy. When the low-frequency voltage is increased or the low frequency is decreased, the excessive ion bombardment energy may also induce secondary electron emission, resulting in a sharp increase in plasma density which greatly degrades the independent controllability of ion flux and ion energy.

However, the circuit structure in the prior art cannot effectively process signals in the low-frequency power supply and the high-frequency power supply, thus leading to the increase of ion bombardment energy which may easily damage the substrate surface. Moreover, the circuit structure in the prior art cannot address the intense coupling effect between the high-frequency power supply and the low-frequency power supply, which is adverse to the independent control of ion flux and ion energy.

SUMMARY

Given the shortcomings of the prior art, the present disclosure aims to provide a power supply system for improving plasma uniformity and a method of the same, which can effectively process signals in a low-frequency power supply and a high-frequency power supply, improve the stability of plasma discharge, reduce the coupling effect between the high-frequency power supply and the low-frequency power supply, and realize the independent control of ion flux and ion energy in the context that the plasma uniformity has been improved.

In order to achieve the above purpose, the present disclosure provides the following scheme:

A power supply system for improving plasma uniformity, including a signal generating device, a first electrode, and a second electrode;

the signal generating device includes a signal generator and a plurality of signal processing circuits;

the signal generator is respectively connected with the plurality of signal processing circuits and is used for generating a plurality of initial signals at different frequencies;

the signal processing circuits are used for processing the initial signals at corresponding frequencies;

the plurality of signal processing circuits are all connected with the first electrode; the second electrode is arranged opposite to the first electrode and grounded; the plasma is arranged between the first electrode and the second electrode; and the initial signals, after being processed through signal processing circuits, act on the plasma through the first electrode.

Preferably, the nth initial signal output by the signal generator is:

$$V_{fun}(t)=V_{fun,n}\cos(2\pi nft+\theta_{fun,n})$$

where $V_{fun}(t)$ is the voltage of the nth initial signal (n is a positive integer), f is the fundamental frequency, $V_{fun,n}$ represents the amplitude of the nth harmonic voltage corresponding to the nth initial signal, $\theta_{fun,n}$ represents the phase angle of the nth harmonic voltage corresponding to the nth initial signal, and t represents time.

Preferably, the signal processing circuit includes:

a power amplifier, connected with the signal generator and used for amplifying the initial signal at the corresponding frequency to obtain an amplified signal.

Preferably, the signal processing circuit also includes:

a matching network, connected with the power amplifier and used for impedance matching of the amplified signal to obtain a matched signal.

Preferably, the signal processing circuit also includes:

a filter, connected with the matching network and used for filtering the matched signal.

Preferably, it also includes a waveform measuring device;

the waveform measuring device is connected with the first electrode, and is use for measuring and displaying a signal voltage applied to the first electrode.

Preferably, the waveform measuring device includes:

a differential probe, connected with the first electrode for detecting the voltage on the first electrode; and an oscilloscope, connected with the differential probe and used for displaying the voltage waveform measured by the differential probe.

Preferably, it also includes a DC blocking capacitor;

the DC blocking capacitor is arranged between the first electrode and the matching network, and is used for isolating DC component of signals in the matching network.

Preferably, the first electrode is a circular plate electrode, and the second electrode is a circular plate electrode or a coil.

The present disclosure also provides a method for improving plasma uniformity, which is applied to a power supply system for improving plasma uniformity. The method includes:

superposing the processed signals output by the plurality of signal processing circuits to obtain a voltage waveform signal applied to the first electrode;

performing the fast Fourier transform on the voltage waveform signal to obtain a phase angle $\theta_1$ of the fundamental frequency voltage and a phase angle $\theta_n$ of the nth harmonic voltage corresponding to the nth signal; and according to the phase angle of the fundamental frequency voltage and the phase angle of the nth harmonic voltage, adjusting the relative phase angle $\theta$ between the fundamental frequency voltage and the nth harmonic voltage corresponding to the nth signal by $\theta=\theta_1-(\theta_n/n)$.

According to embodiments provided in the present disclosure, the present disclosure discloses the following technical effects:

The present disclosure provides a power supply system for improving plasma uniformity and a method thereof, where the signal generator is respectively connected with a plurality of signal processing circuits which are all connected with the first electrode, and different signal processing circuits correspond to different processed signals in order to avoid the impact caused by the coupling of power supply signals at different frequencies. The plurality of signal processing circuits are used to process the signals at different frequencies generated by the signal generator, and then apply the processed signals to the first electrode, thereby improving the stability of plasma discharge.

BRIEF DESCRIPTION OF THE DRAWINGS

In order to illustrate the embodiments of the present disclosure or technical schemes in the prior art more clearly, the accompanying drawings required in the embodiments will be briefly introduced below. Apparently, the drawings in the following description are only some embodiments of the present disclosure, and those of ordinary skills in the art may obtain other drawings according to these drawings without creative work.

DETAILED DESCRIPTION

Technical schemes in the embodiments of the present disclosure will be described clearly and completely with reference to the accompanying drawings thereof. Apparently, the embodiments described herein are only part of, not all of, embodiments in the present disclosure. Based on the embodiments of the present disclosure, all other embodiments obtained by those of ordinary skills in the art without creative work belong to the scope claimed by the present disclosure.

The present disclosure aims to provide a power supply system for improving plasma uniformity and a method of the same, which can effectively process signals in a low-frequency power supply and a high-frequency power supply, improve the stability of plasma discharge, reduce the coupling effect between the high-frequency power supply and the low-frequency power supply, and realize the independent control of ion flux and ion energy in the context that the plasma uniformity has been improved.

To make the above mentioned purposes, features and advantages of the present disclosure more apparent and easier to understand, the present disclosure will be further described with reference to figures and embodiments below.

Figure 1:
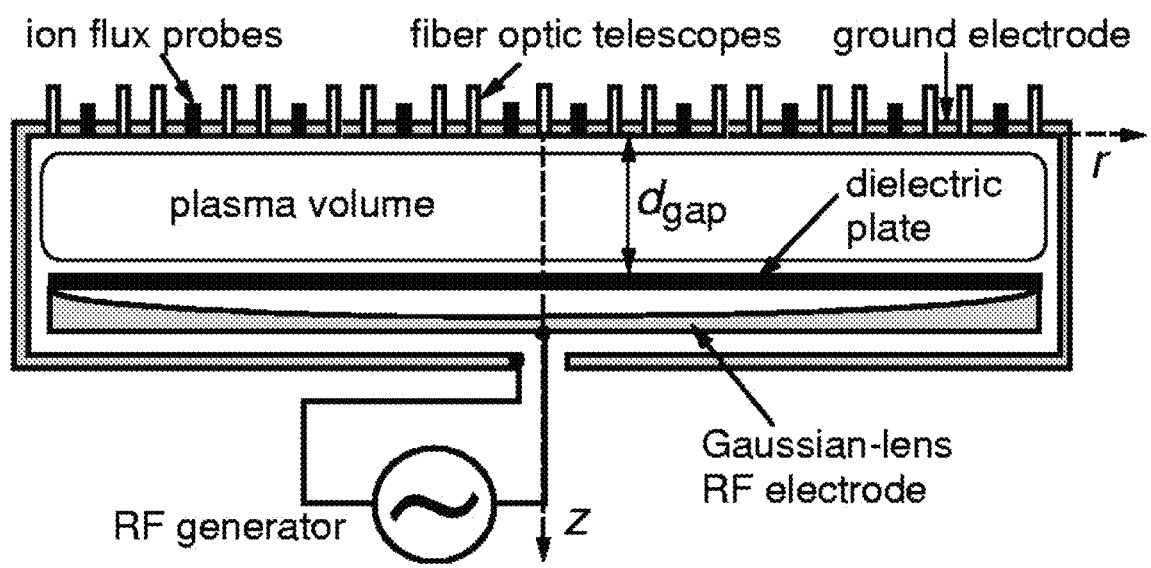
FIG. 1 is a schematic structural diagram of an electrode shaped as a Gaussian lens in the prior art.
Figure 2:
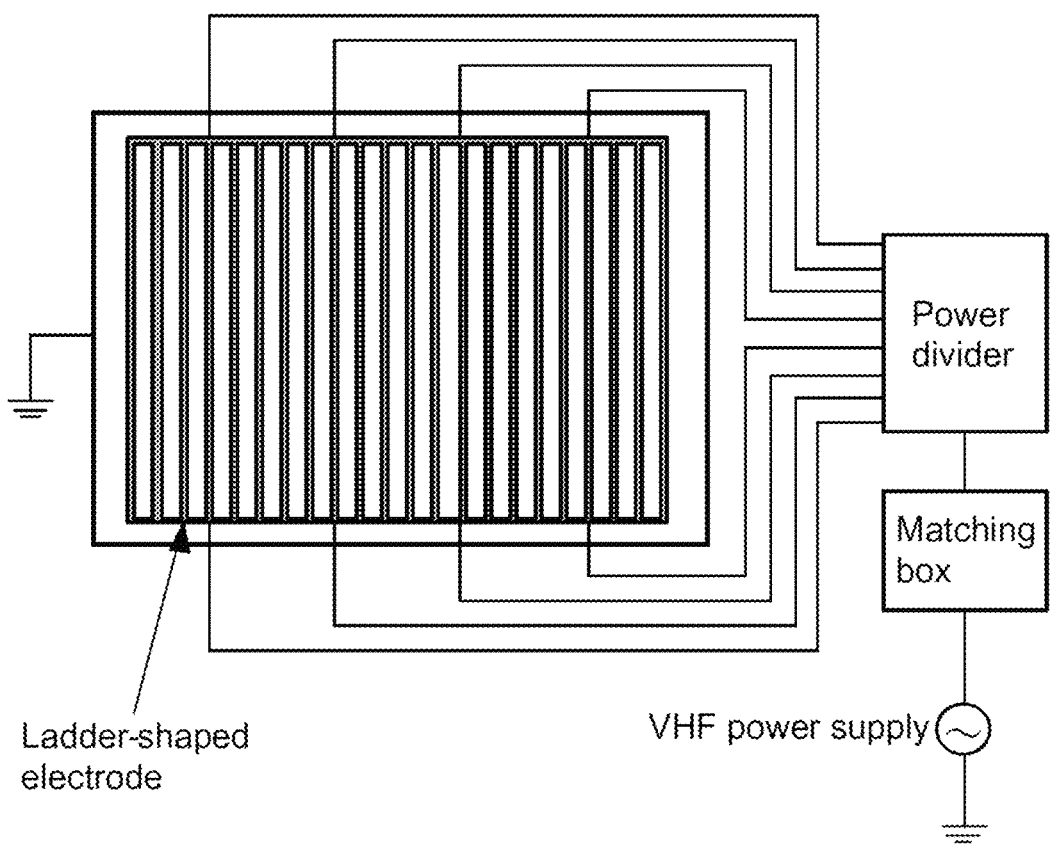
FIG. 2 is a schematic structural diagram of a ladder-shaped electrode in the prior art.
Figure 3:
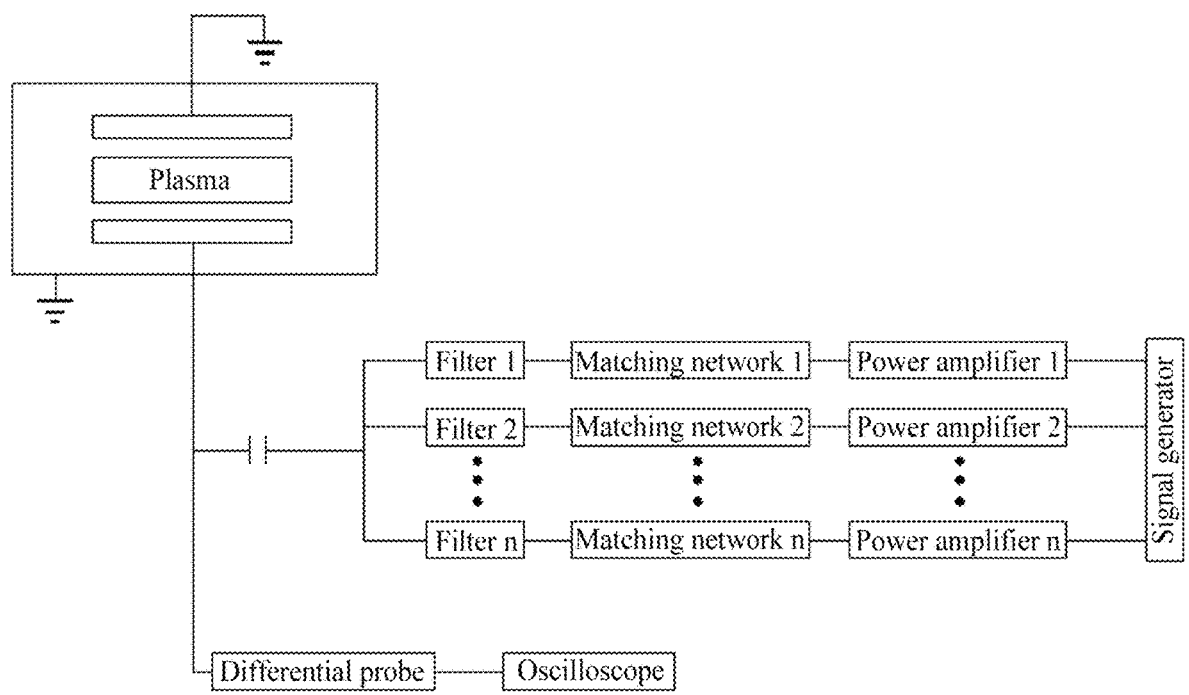
FIG. 3 is a device connection diagram of a power supply system for improving plasma uniformity according to the present disclosure.

FIG. 3 is a device connection diagram of a power supply system for improving plasma uniformity according to the present disclosure. As shown in FIG. 3, the present disclosure provides a power supply system for improving plasma uniformity, including a signal generating device, a first electrode, and a second electrode;

the signal generating device includes a signal generator and a plurality of signal processing circuits;

the signal generator is respectively connected with the plurality of signal processing circuits and is used for generating a plurality of initial signals at different frequencies;

the signal processing circuits are used for processing the initial signals at corresponding frequencies;

the plurality of signal processing circuits are all connected with the first electrode; the second electrode is arranged opposite to the first electrode and grounded; the plasma is arranged between the first electrode and the second electrode; and the initial signals, after being processed by the signal processing circuits, act on the plasma through the first electrode.

Specifically, the signal processing circuit includes:

a power amplifier, connected with the signal generator and used for amplifying the initial signal at the corresponding frequency to obtain an amplified signal.

Optionally, the signal processing circuit also includes:

a matching network, connected with the power amplifier and used for impedance matching of the amplified signal to obtain a matched signal.

Optionally, the signal processing circuit also includes:

a filter, connected with the matching network and used for filtering the matched signal.

Preferably, it also includes a DC blocking capacitor;

the DC blocking capacitor is arranged between the first electrode and the matching network, and is used for isolating DC component of signals in the matching network.

Optionally, each signal is amplified by an independent power amplifier, and passes through a respective matching network and a corresponding filter in turn to apply to the first electrode. A DC blocking capacitor is arranged between each filter and the driving electrode. The upper electrode and the chamber side wall are grounded.

Specifically, the first electrode is a circular plate electrode, and the second electrode is a circular plate electrode or a coil.

Preferably, the nth initial signal output by the signal generator is:

$$V_{fun}(t)=V_{fun,n}\cos(2\pi nft+\theta_{fun,n})$$

where $V_{fun}(t)$ is the voltage of the nth initial signal (n is a positive integer), f is the fundamental frequency, $V_{fun,n}$ represents the amplitude of the nth harmonic voltage corresponding to the nth initial signal, $\theta_{fun,n}$ represents the phase angle of the nth harmonic voltage corresponding to the nth initial signal, and t represents time.

Preferably, it also includes a waveform measuring device;

the waveform measuring device is connected with the first electrode, and is use for measuring and displaying a signal voltage applied to the first electrode.

As an optional implementation, the waveform measuring device includes:

a differential probe, connected with the first electrode for detecting the voltage on the first electrode; and an oscilloscope, connected with the differential probe and used for displaying the voltage waveform measured by the differential probe.

Optionally, the differential probe is a voltage probe.

Figure 4:
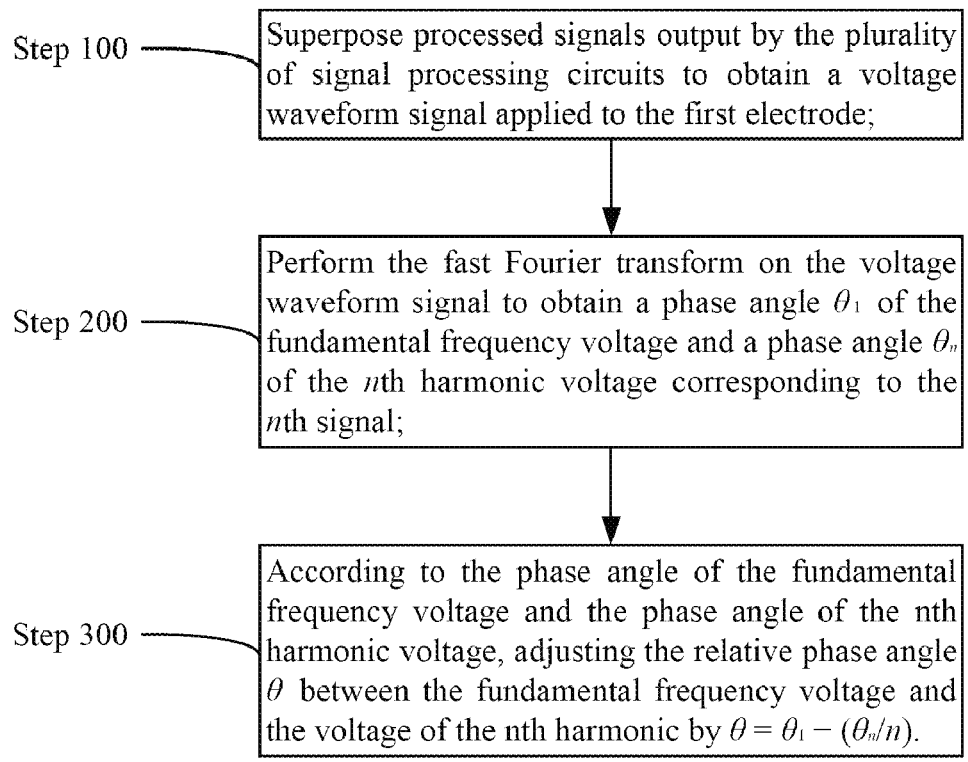
FIG. 4 is a flowchart of a method for improving plasma uniformity according to the present disclosure.

The present disclosure also provides a method for improving plasma uniformity, which is applied to a power supply system for improving plasma uniformity. FIG. 4 is a flowchart of a method for improving plasma uniformity according to the present disclosure. As shown in FIG. 4, the method includes:

In Step 100: Superposing processed signals output by the plurality of signal processing circuits to obtain a voltage waveform signal applied to the first electrode;

In Step 200: Performing the fast Fourier transform on the voltage waveform signal to obtain a phase angle θ$_1$ of the fundamental frequency voltage and a phase angle θ$_n$ of the nth harmonic voltage corresponding to the nth signal;

In Step 300: According to the phase angle of the fundamental frequency voltage and the phase angle of the nth harmonic voltage, adjusting the relative phase angle θ between the fundamental frequency voltage and the nth harmonic voltage by θ=θ$_1$−(θ$_n$/n).

Preferably, the voltage waveform on the surface of the first electrode is detected by a voltage probe and displayed on an oscilloscope. The voltage waveform applied to the surface of the first electrode can be expressed as:

$$V(t)=\sum_{n=1}^{N}V_n\cos(2\pi nft+\theta_n)$$

The amplitude $V_n$ and phase $\theta_n$ of the nth harmonic voltage can be obtained by performing the fast Fourier transform on V(t), where $V_n$ is ranged within 0-5000 V, θ$_n$ is ranged within 0°-360°, the fundamental frequency f is ranged within 0.1-300 MHz, and N is a total number of signals.

Specifically, the voltage waveform on the electrode surface is not an ideal one, so it is necessary to adjust the amplitude and phase of each harmonic component in a signal output by the signal generator so that the voltage waveform on the electrode surface finally gets close to the ideal voltage waveform.

Figure 5:
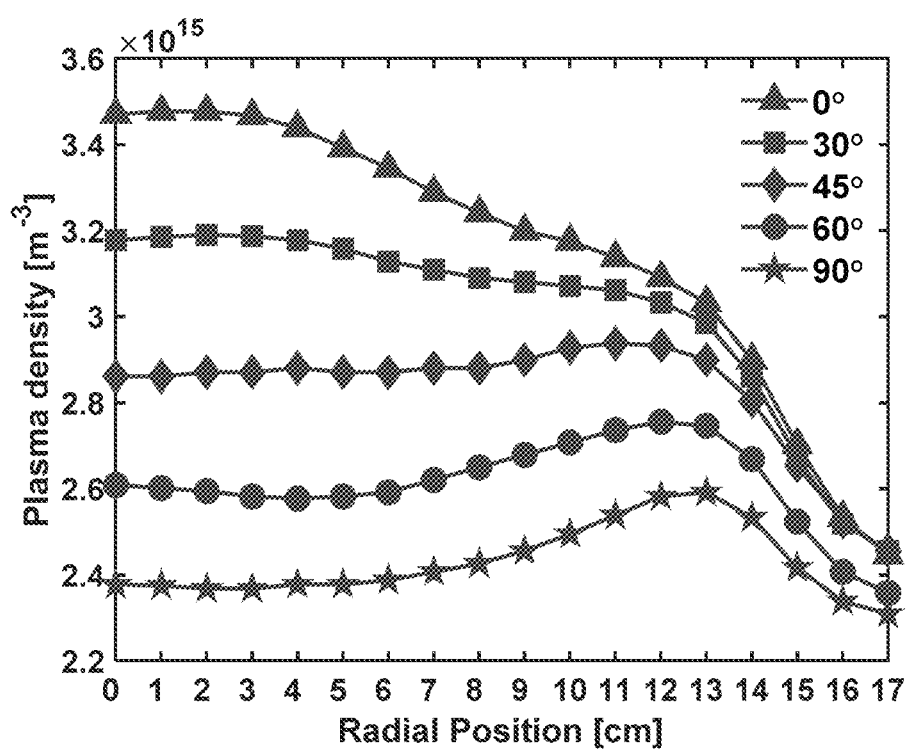
FIG. 5 is a graph showing the rule of the influence, caused by a relative phase angle $\theta=\theta_1-(\theta_2/2)$ between a fundamental frequency and a second harmonic voltage when n=2, on the radial distribution of plasma density in a power supply system for improving plasma uniformity and a method thereof according to the present disclosure.

FIG. 5 is a graph showing the rule of the influence, caused by a relative phase angle (°) between a fundamental frequency and a second harmonic voltage when n=2, on the radial distribution of plasma density in a power supply system for improving plasma uniformity according to the present disclosure, where $V_1$ and $V_2$ are both fixed as 50 V, and f is fixed as 30 MHz. By regulating the signal generator, the amplitude $V_{fun,n}$ and phase $\theta_{fun,n}$ of each harmonic voltage in the signal output by the signal generator can be changed, and thus the amplitude $V_n$ and phase $\theta_n$ of each harmonic voltage in the arbitrary-waveform voltage V(t) on the driving electrode can be controlled. As shown in FIG. 5, when the relative phase angle θ is 0°, the plasma density shows a "central peak" distribution due to the dominance of standing wave effect, resulting in a poor plasma uniformity. As the relative phase angle θ is increasing, the standing wave effect gradually weakens, and the "central peak" feature in the plasma density profile gradually disappears, thereby optimizing the plasma uniformity. Especially when θ is 0°, the plasma uniformity reaches the best. It can be seen that the plasma uniformity can be significantly improved by adjusting the phase angle θ between the fundamental frequency and the second harmonic voltage, thus providing the possibility of optimizing the plasma etching uniformity and the film deposition uniformity. In addition, by adjusting the voltage amplitude ratio of the fundamental frequency to the second harmonic, the radial distribution of plasma density can also be adjusted and controlled, and the plasma uniformity can be optimized as well.

Specifically, the amplitudes of the fundamental frequency voltage and a higher-order harmonic voltage can be either equal or different, and the amplitudes of the fundamental frequency voltage and a higher-order harmonic voltage can be changed randomly.

Figure 6:
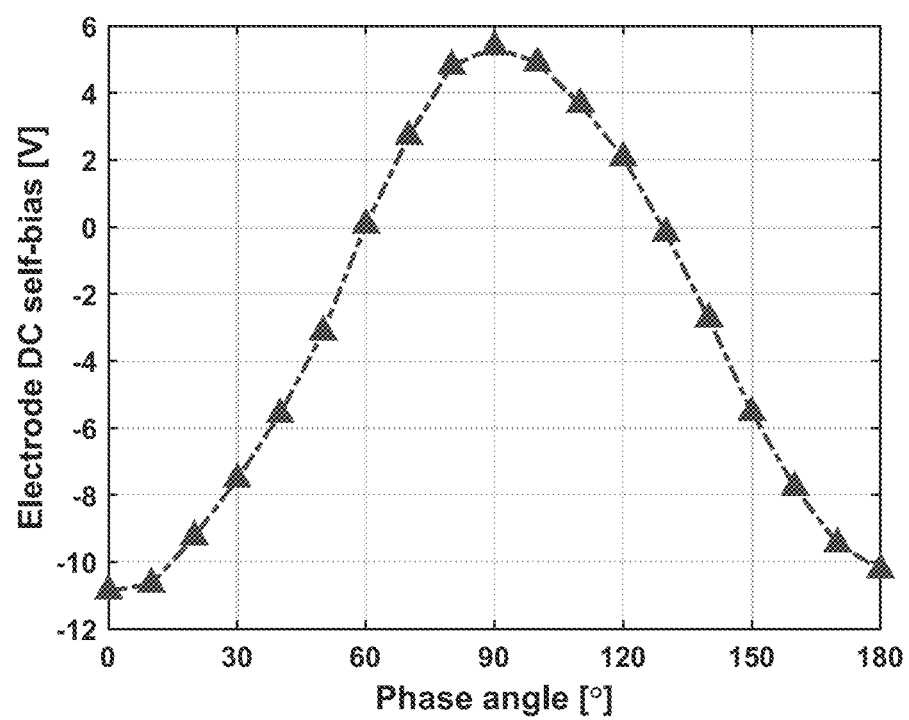
FIG. 6 is a graph showing the rule of the influence, caused by the relative phase angle θ=θ$_1$−(θ$_2$/2) between the fundamental frequency and the second harmonic voltage when n=2, on the DC self-bias on an electrode plate surface in a power supply system for improving plasma uniformity and a method thereof according to the present disclosure.

FIG. 6 is a graph showing the rule of the influence, caused by the relative phase angle θ=$\theta_1$-($\theta_2$/2) between the fundamental frequency and the second harmonic voltage when n=2, on the DC self-bias on an electrode plate surface in a power supply system for improving plasma uniformity according to the present disclosure. As shown in FIG. 6, when θ is 0°, the DC self-bias reaches a minimum; as θ increases, the DC self-bias gradually increases from negative to positive; and when θ is 90°, the DC self-bias reaches a maximum. In the range of 90°≤θ≤180°, as θ increases, the DC self-bias decreases monotonously and changes gradually from positive to negative. It can be seen that by adjusting the phase angle θ between the fundamental frequency and the second harmonic voltage, the DC self-bias on the electrode plate can be flexibly adjusted and controlled in amplitude. Since this self-bias amplitude directly determines the ion energy in the discharge, the ion flux and ion energy can be independently controlled by using this method, thereby achieving a better etching anisotropy, a higher etching aspect ratio and a better film performance.

The present disclosure is specifically beneficial in:

(1) The plurality of signal processing circuits are used to process the signals at different frequencies generated by the signal generator, and then apply the processed signals to the first electrode, thereby improving the stability of plasma discharge. Also, the plurality of signal processing circuits are used to process the plurality of initial signals at the same time, in order to decrease the coupling between power supply signals at different frequencies.

(2) The optimization of plasma uniformity can be simply realized by adjusting power supply parameters without machining complexly structured electrodes at a high cost, and the process parameter window is wide for flexible and convenient operation.

(3) The independent control of the ion flux and ion energy can be realized by adjusting the phase angle between the fundamental frequency voltage and the higher-order harmonic voltage, or by adjusting the voltage amplitude ratio of the fundamental frequency voltage to the higher-order harmonic voltage.

(4) A higher plasma density can be realized.

In this specification, various embodiments are described in a progressive manner, with each embodiment focusing on its differences from other embodiments, while cross reference would be enough for those same or similar parts between the embodiments. As the method disclosed in the embodiment corresponds to the system disclosed in the embodiment, the description is relatively simple, and the correlated parts can be found in the system description.

Principles and implementation of this present disclosure are described by specific examples, and the explanation of the above embodiments is only used to help understand the method and its core idea of the present disclosure. Also, those of ordinary skills in the art may take some modifications in the specific implementation and application scope according to the idea of the present disclosure. To sum up, the content of this specification should not be construed as limiting the present disclosure.

What is claimed is:

1. A power supply system for improving plasma uniformity, comprising a signal generating device, a first electrode, and a second electrode, wherein
   the signal generating device comprises a signal generator and a plurality of signal processing circuits;
   the signal generator is respectively connected with the plurality of signal processing circuits and is used for generating a plurality of initial signals at different frequencies, and an nth initial signal output by the signal generator is:

$V_{fun}(t)=V_{fun,n}\cos(2\pi nft+\theta_{fun,n})$, wherein $V_{fun}(t)$ is a voltage of the nth initial signal (n is a positive integer), f is a fundamental frequency, $V_{fun,n}$ represents an amplitude of an nth harmonic voltage corresponding to the nth initial signal, $\theta_{fun,n}$ represents a phase angle of the nth harmonic voltage corresponding to the nth initial signal, and t represents time;
   the signal processing circuits are used for processing the initial signals at corresponding frequencies; and
   the plurality of signal processing circuits are all connected with the first electrode; the second electrode is arranged opposite to the first electrode and grounded; the plasma is arranged between the first electrode and the second electrode; and the initial signals, after being processed by the signal processing circuits, act on the plasma through the first electrode.

2. The power supply system for improving plasma uniformity according to claim 1, wherein the signal processing circuit comprises:

a power amplifier, connected with the signal generator and used for amplifying the initial signal at the corresponding frequency to obtain an amplified signal.

3. The power supply system for improving plasma uniformity according to claim 2, wherein the signal processing circuit further comprises:
a matching network, connected with the power amplifier and used for impedance matching of the amplified signal to obtain a matched signal.

4. The power supply system for improving plasma uniformity according to claim 3, wherein the signal processing circuit further comprises:
a filter, connected with the matching network and used for filtering the matched signal.

5. The power supply system for improving plasma uniformity according to claim 3, further comprising: a DC blocking capacitor,
wherein the DC blocking capacitor is arranged between the first electrode and the matching network, and is used for isolating DC component of signals in the matching network.

6. The power supply system for improving plasma uniformity according to claim 1, further comprising: a waveform measuring device,
wherein the waveform measuring device is connected with the first electrode, and is used for measuring and displaying a signal voltage applied to the first electrode.

7. The power supply system for improving plasma uniformity according to claim 6, wherein the waveform measuring device further comprises:
a differential probe, connected with the first electrode for detecting the voltage on the first electrode; and
an oscilloscope, connected with the differential probe and used for displaying the voltage waveform measured by the differential probe.

8. The power supply system for improving plasma uniformity according to claim 1, wherein the first electrode is a circular plate electrode, and the second electrode is a circular plate electrode or a coil.

9. A method for improving plasma uniformity, which is applied to a power supply system, the system comprises a signal generating device, a first electrode, and a second electrode, wherein
the signal generating device comprises a signal generator and a plurality of signal processing circuits;
the signal generator is respectively connected with the plurality of signal processing circuits and is used for generating a plurality of initial signals at different frequencies;
the signal processing circuits are used for processing the initial signals at corresponding frequencies; and
the plurality of signal processing circuits are all connected with the first electrode; the second electrode is arranged opposite to the first electrode and grounded; the plasma is arranged between the first electrode and the second electrode; and the initial signals, after being processed by the signal processing circuits, act on the plasma through the first electrode;
the method comprises:
superposing the processed signals output by the plurality of signal processing circuits to obtain a voltage waveform signal applied to the first electrode;
performing the fast Fourier transform on the voltage waveform signal to obtain a phase angle $\theta_1$ of the fundamental frequency voltage and a phase angle $\theta_n$ of the nth harmonic voltage corresponding to the nth signal; and
according to the phase angle of the fundamental frequency voltage and the phase angle of the nth harmonic voltage, adjusting the relative phase angle $\theta$ between the fundamental frequency voltage and the nth harmonic voltage corresponding to the nth signal by $\theta=\theta_1-(\theta_n/n)$.

10. The method for improving plasma uniformity according to claim 9, wherein an nth initial signal output by the signal generator is:

$$V_{fun}(t)=V_{fun,n}\cos(2\pi nft+\theta_{fun,n})$$

wherein $V_{fun}(t)$ is the voltage of the nth initial signal (n is a positive integer), f is the fundamental frequency, $V_{fun,n}$ represents the amplitude of the nth harmonic voltage corresponding to the nth initial signal, $\theta_{fun,n}$ represents the phase angle of the nth harmonic voltage corresponding to the nth initial signal, and t represents time.

11. The method for improving plasma uniformity according to claim 9, wherein the signal processing circuit comprises:
a power amplifier, connected with the signal generator and used for amplifying the initial signal at the corresponding frequency to obtain an amplified signal.

12. The method for improving plasma uniformity according to claim 11, wherein the signal processing circuit further comprises:
a matching network, connected with the power amplifier and used for impedance matching of the amplified signal to obtain a matched signal.

13. The method for improving plasma uniformity according to claim 12, wherein the signal processing circuit further comprises:
a filter, connected with the matching network and used for filtering the matched signal.

14. The method for improving plasma uniformity according to claim 12, further comprising: a DC blocking capacitor,
wherein the DC blocking capacitor is arranged between the first electrode and the matching network, and is used for isolating DC component of signals in the matching network.

15. The method for improving plasma uniformity according to claim 9, further comprising: a waveform measuring device,
wherein the waveform measuring device is connected with the first electrode, and is used for measuring and displaying a signal voltage applied to the first electrode.

16. The method for improving plasma uniformity according to claim 15, wherein the waveform measuring device further comprises:
a differential probe, connected with the first electrode for detecting the voltage on the first electrode; and
an oscilloscope, connected with the differential probe and used for displaying the voltage waveform measured by the differential probe.

17. The method for improving plasma uniformity according to claim 9, wherein the first electrode is a circular plate electrode, and the second electrode is a circular plate electrode or a coil.

* * * * *